US004001793B2

United States Statutory Invention Registration [19]

[11] Reg. Number: H1793

[45] Published: Apr. 6, 1999

Peterson et al.

[54] THERMAL TRANSIENT TEST SYSTEM

[75] Inventors: Ronald H. Peterson; Keith S. Pickens, both of San Antonio, Tex.

[73] Assignee: The United States of America as represented by the Secretary of the Army, Washington, D.C.

[21] Appl. No.: 919,186

[22] Filed: Aug. 18, 1997

[51] Int. Cl.[6] ..... H03H 1/00

[52] U.S. Cl. ..... 323/367

[58] Field of Search ..... 323/367; 324/705, 324/706, 714; 364/807

[56] References Cited

U.S. PATENT DOCUMENTS

| | | | |
|---|---|---|---|
| 3,784,906 | 1/1974 | Ironside | 324/706 |
| 4,209,837 | 6/1980 | Brown | 364/143 |
| 4,408,157 | 10/1983 | Beaubien | 324/706 |
| 4,481,596 | 11/1984 | Townzen | 364/571 |
| 5,272,445 | 12/1993 | Lloyd | 324/706 |

*Primary Examiner*—Daniel T. Pihulic
*Attorney, Agent, or Firm*—Michael Sachs

[57] ABSTRACT

A pyrotechnic device (UUT) is automatically tested for thermal response characteristics using an automatically balanced Wheatstone bridge. One branch of the bridge is a series of relay connected resistances which are selectively connected to coursely balance the bridge using a voltage developed across the UUT. An FET in series with the series of resistances, in response to the bridge null currents, finely balances the bridge. A low constant current pulse is used to generate a voltage across the UUT and to balance the bridge. A second high constant current pulse is used to measure the transient thermal response of the UUT. The transient test current pulses are generated automatically or manually and whose amplitude and repetition rate are manually set. The pulses are generated by a D/A converter whose output is fed to a constant current generator coupled to a manually settable resistance range for setting the value of the high current transient test pulse amplitude. The lower value initial balance current pulse is separately settable by internal calibration switches and straps. The entire test is less than 40 ms.

33 Claims, 8 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

FIG. 6a
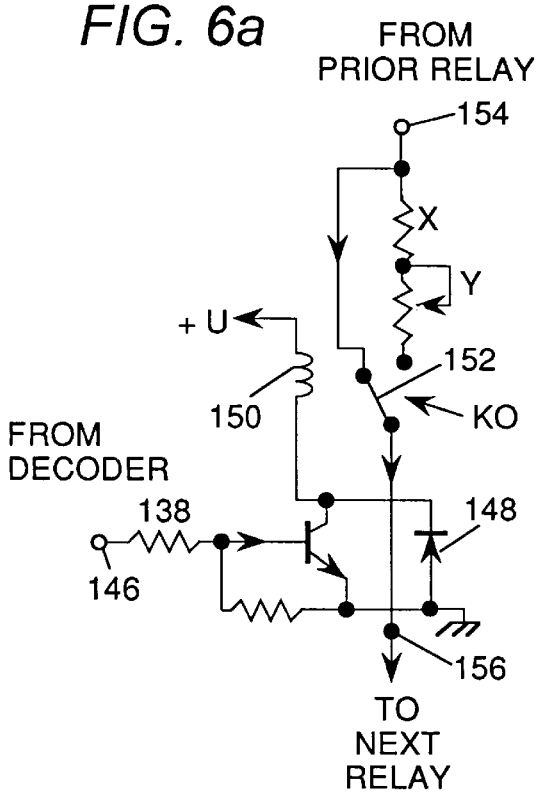
| K# | 1% MF X | CERMET Y | X + Y RESIS. SETTING |
|---|---|---|---|
| K0 | 0 | 10 | 1 |
| K1 | 0 | 10 | 4 |
| K2 | 12.7 | 10 | 16 |
| K3 | 59.0 | 10 | 64 |
| K4 | 249 | 100 | 256 |
| K5 | 1000 | 100 | 1024 |
| K6 | 0 | 10 | 2 |
| K7 | 0 | 10 | 8 |
| K8 | 28.7 | 10 | 32 |
| K9 | 121 | 10 | 128 |
| K10 | 487 | 100 | 512 |
| K11 | 2000 | 100 | 2848 |
FIG. 6b
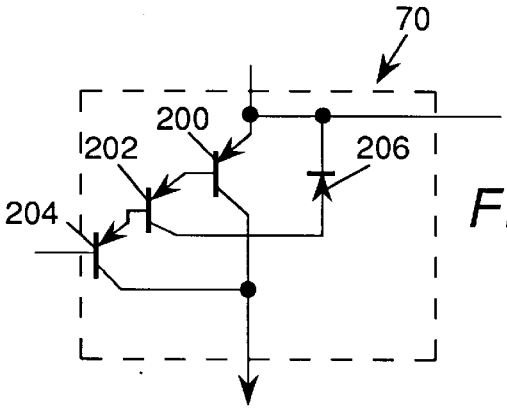
FIG. 4a

NORMAL RESPONSE

POOR BRIDGEWIRE CONTACT

POOR BRIDGEWIRE WELD

BRIDGEWIRE MOVEMENT DUE TO AIRGAP

ENTRAPPED SOLVENT PHASE TRANSFORMATION (LIQUID TO GAS)

LOW THERMAL RESPONSE

THERMAL TRANSIENT TEST SYSTEM

GOVERNMENT INTEREST

This invention may be made, used or licensed by or for the U.S. Government pursuant to contract D A A K-10-84-C-0206 awarded by the Department of the Army.

FIELD OF THE INVENTION

This invention relates to testing thermal transient response characteristics of a resistor and more particularly to determine automatically the value of an unknown resistance and for setting the null condition of a wheatstone bridge during such testing.

BACKGROUND OF THE INVENTION

Prior art thermal transient testers employ a manually balanced wheatstone bridge. This bridge comprises two fixed resistors in two branches; an electro-explosive device under test forming a third branch and a set of variable resistors forming a fourth branch. The electro-explosive device comprises a pyrotechnic device having a pair of terminals to which is connected a bridge wire of relatively low resistance. A pyrotechnic material encases the bridge wire. When an electric current pulse of sufficient amplitude is applied to the device terminals, the bridge wire is heated to a point where the ignition temperature of the pyrotechnic material is reached and the pyrotechnic material ignites. It is important to test these pyrotechnic devices for proper resistance values of the bridge wire and also for the thermal response characteristics of the bridge wire to ensure that the pyrotechnic material will in fact ignite when an ignition current pulse is applied to the device terminals. Otherwise failure of the device to ignite creates safety and other problems.

For these reasons the transient tester mentioned above is utilized in the prior art for determining both the resistance of the device and for testing the thermal response characteristics of the device to ensure the device meets its specified requirements so that it will in fact ignite in response to an appropriate ignition current signal applied thereto.

To test such devices for thermal transient response, the device is inserted as one arm or branch of the manually balanced bridge. The variable resistors are shifted in value for nulling the bridge. A current pulse is then applied to the bridge input nodes. The current pulse has an amplitude sufficient to heat the bridge wire of the electro-explosive device an amount sufficient to generate a thermal response in the bridge wire. The thermal response is then measured and observed on an oscilloscope for appropriate analysis. This approach is cumbersome and awkward and, further, the number of devices tested is limited to several per minute in response to the need for an operator to balance manually the bridge for each device, test the device, remove the device and insert a new device and rebalance the bridge for the new device.

The bridge is balanced or nulled in order to cancel the effect of the resistance value of the electro-explosive device under test. In this way, the thermal response characteristic curve of the device is a measure only of the thermal response of the device and does include the actual resistance of the device which may complicate the test result.

The present invention is directed to a need recognized by the present inventors for an automatic system for testing the electro-explosive device described above automatically and rapidly. This automatic testing of the device results in several problems including automatically measuring the device resistance and automatically balancing the bridge so as to achieve a null condition for applying a thermal transient current signal to the device.

SUMMARY OF THE INVENTION

A test apparatus according to the present invention provides a resistance of a certain value and includes control means for generating at least one control signal. First circuit means include a settable resistance responsive to at least one control signal for setting the settable resistance to a first value approximating the certain value. Second means are responsive to the at least one control signal for setting the settable resistance to a second value which is substantially the same as the certain value.

In accordance with one embodiment of the present invention, the control means includes means for automatically causing initially the setting of the settable resistance to the first resistance value and then automatically causing the setting of the settable resistance to the second resistance value.

In a further embodiment, the first circuit means includes a resistor ladder network of series connected resistances of different first values and said second means includes a second variable analog resistance means in series with the first circuit means.

The apparatus in accordance with a still further embodiment includes a bridge network having first and second pairs of opposing nodes wherein a resistance is between each of the nodes. The first pair of nodes comprises an input to the bridge network and a second pair of nodes comprise an output of the bridge network. The current value at the second pair of nodes is the same for providing a null current value therebetween when the resistances between each input node and a first output node have the same relative value as the resistances between each input node and the other output node. A settable resistance is between one of the output and one of the input nodes.

In accordance with a still further embodiment, the settable resistance comprises a linear resistance ladder network and an analog FET resistance in series with the network. The resistance ladder network has its resistance value set by a voltage thereacross generated by the device under test and the FET resistance value is set by coupling the FET to the output nodes of the bridge and causing the FET to servo in a manner to balance the bridge automatically.

IN THE DRAWING

FIGS. 4 and 4A are circuit diagrams of a constant current pulser generator utilized in the embodiment of FIG. 1;

Figure 5:
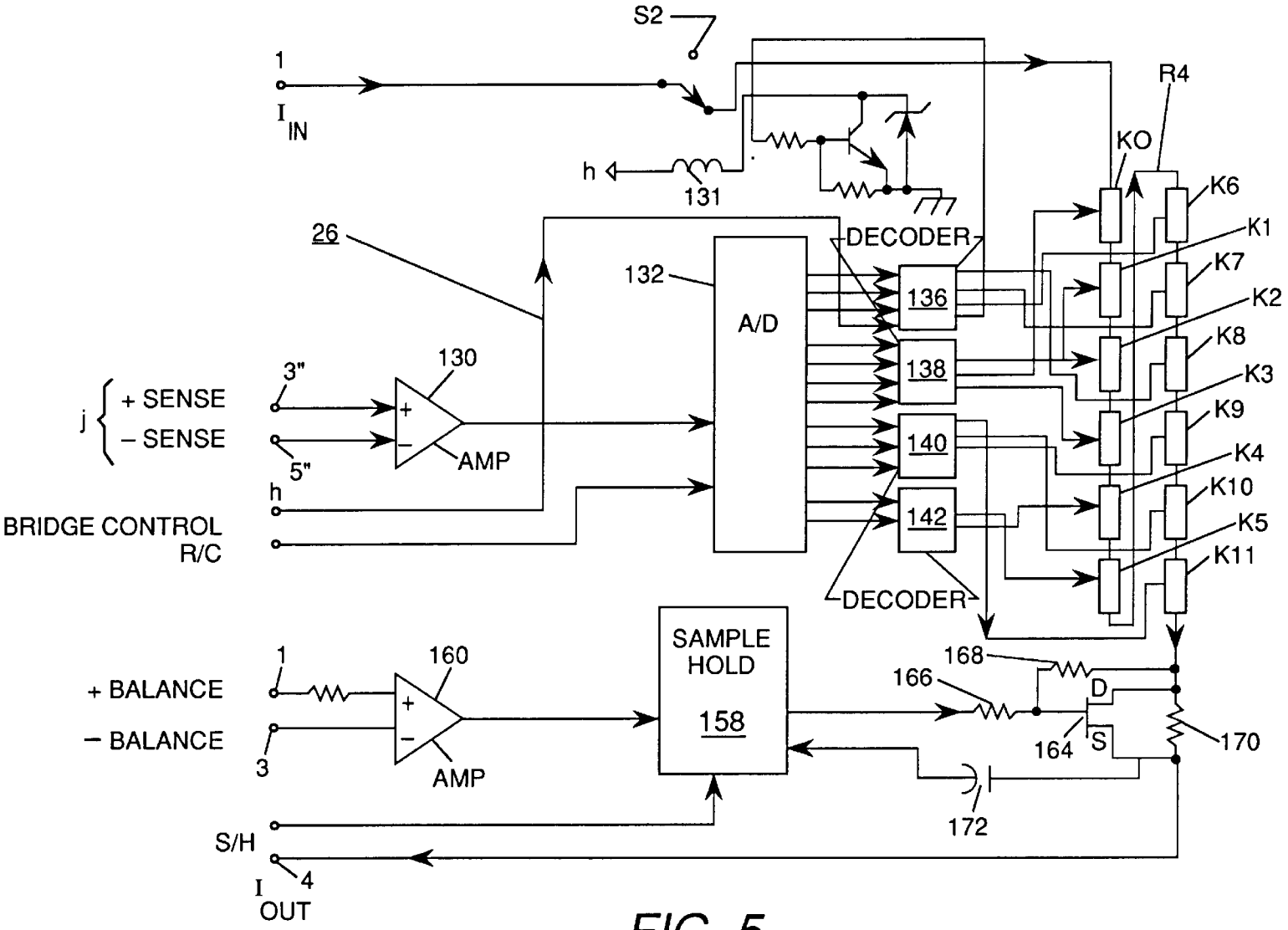
FIG. 5 is a circuit diagram of the settable resistance R4 and the null bridge circuit of FIG. 1.

FIG. 6*a* is a circuit diagram of a relay operated resistor of the resistor ladder network of FIG. 5;

FIG. 6*b* is a chart illustrating exemplary resistance values utilized in the circuit of FIG. 6*a;*

Figure 1:
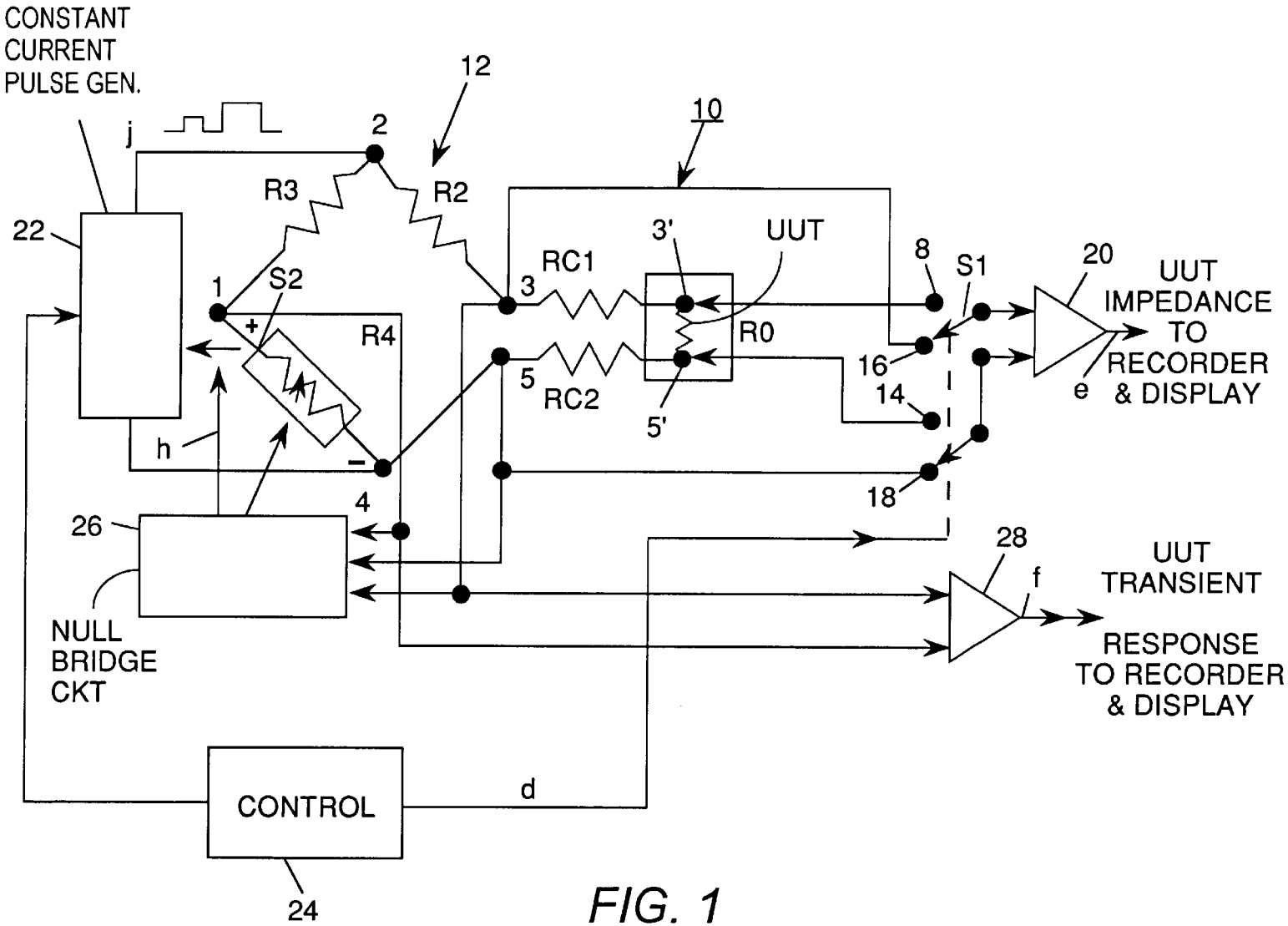
FIG. 1 is a circuit schematic diagram of an apparatus in accordance with one embodiment of the present invention.
Figure 4:
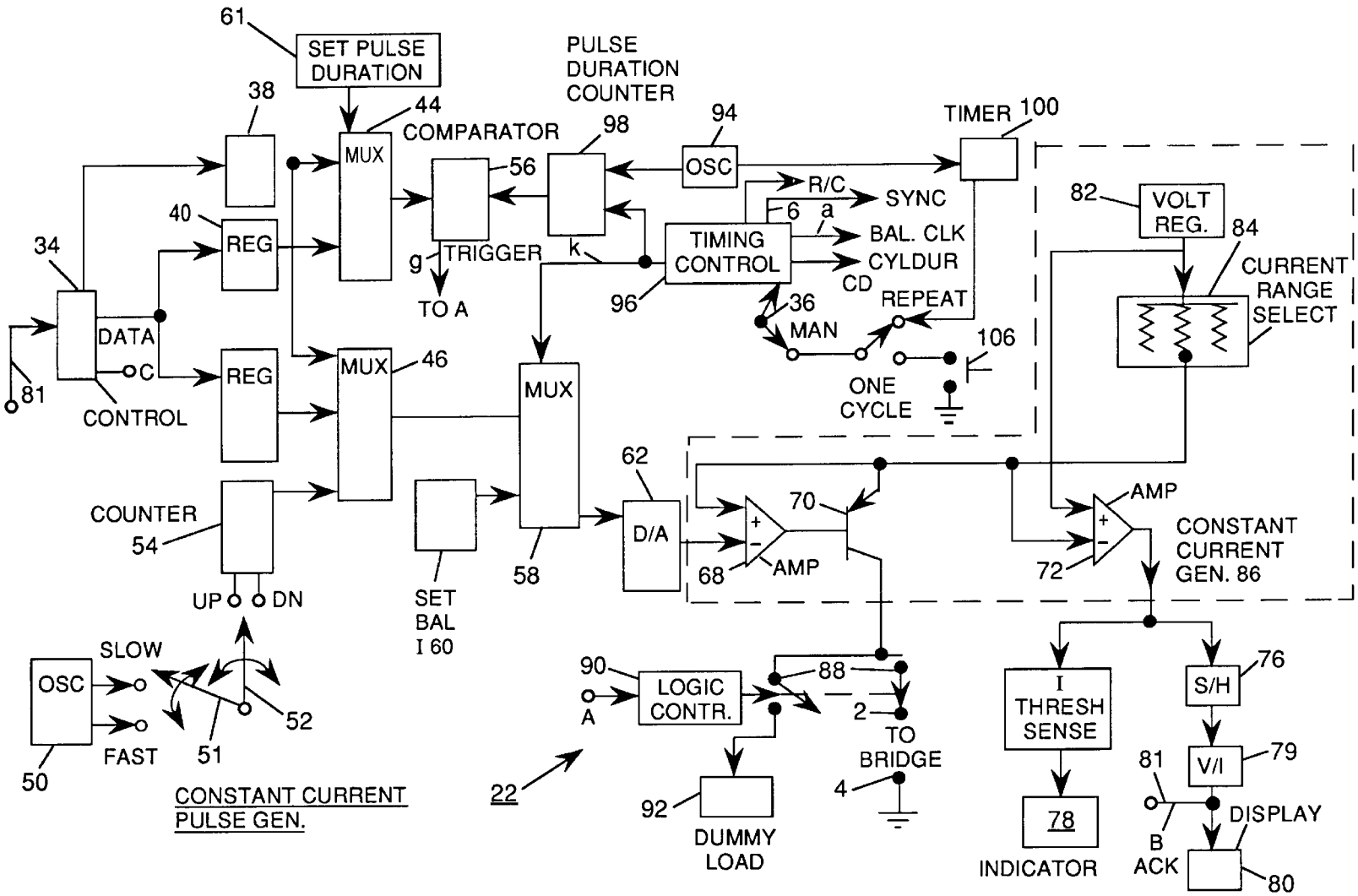
Figure 7:
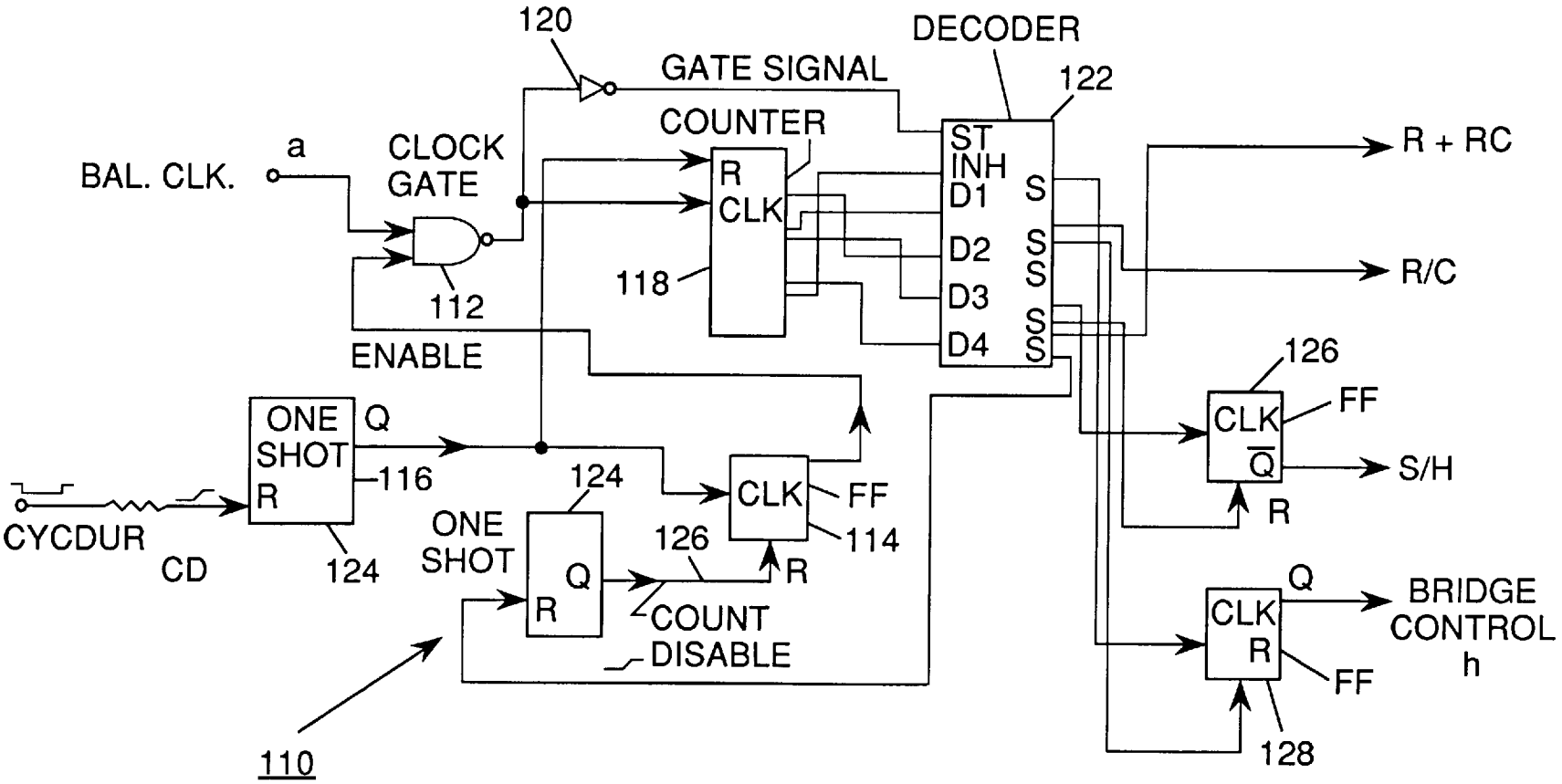
Figure 8:
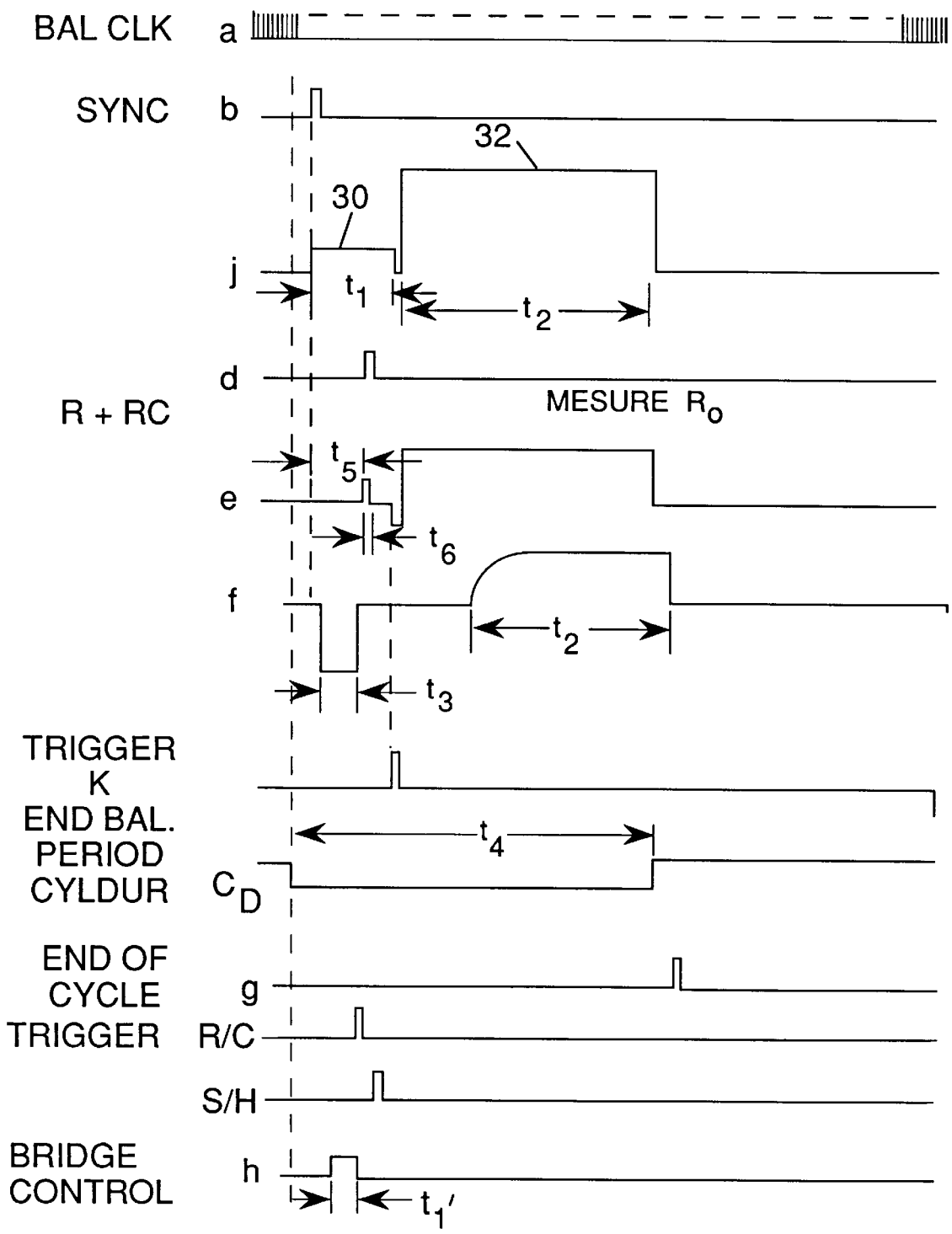

FIG. 7 is a block schematic diagram of a timing circuit for generating certain timing signals utilized in the embodiment of FIGS. 1 and 4;

FIG. 8 is a timing diagram illustrating the different timing relationship of the signals employed in the embodiment of FIG. 1; and FIGS. 9*a* through 9*f* are oscilloscope waveform displays illustrating different thermal responses of a unit under test (UUT) employed in the circuit of the embodiment of FIG. 1.

DETAILED DESCRIPTION OF THE PREFERRED EMBODIMENT

In the following description the same reference numerals in the different figures refer to identical parts. The single conductor wires in the different circuits may represent either single conductors or multiple conductors or computer data buses. In FIG. 1, circuit 10 comprises a wheatstone bridge 12 having input nodes 2 and 4 and output nodes 1 and 3. A resistance is between each of the nodes. Resistances of fixed value R2 and R3 are between respective pairs of nodes 2, 3 and 1, 2. A settable resistance R4 is between nodes 1 and 4. A switch S2 is between node 1 and one terminal of resistance R4. Switch S2 is schematically represented as a manual switch, but in practice may be relay operated, a transistor switch or other switching device.

A fifth node 5 is connected to node 4. A resistance Ro formed by a unit under test (UUT) is coupled between nodes 3 and 5 by a first contact resistance RC1 which is between nodes 3 and 3' and a second resistance RC2 between nodes 5 and 5', the nodes 3' and 5' comprise contact terminals for receiving the leads of the UUT. The values of resistances RC1 and RC2 represent the contact resistance of the UUT inserted into connectors represented by the nodes 3' and 5' and are relatively negligible in comparison to the value of $R_0$. By way of example, the value of resistance R2 may be 5 ohms and the value of resistance R3 may be about 2660 ohms. The resistance value of the UUT $R_0$ may be about 5 ohms. The value of resistance R4 is set to approximate the value of R3 to form a balanced bridge so that the current at nodes 1 and 3 is nulled, a null condition being represented by $$\frac{R3}{R2} = \frac{R4}{R_0 + RC1 + RC2.}$$

Node 3' is connected to a switch S1 terminal 8 and node 5' is connected to a switch S1 terminal 14. Node 3 is connected to switch S1 terminal 16 and node 5 is connected to switch S1 terminal 18. Switch S1 selectively connects either terminals 16 and 18 or terminals 8 and 14 to the inputs of amplifier 20.

Depending on the switch position of switch S1, the output of amplifier 20, signal e, is a signal which manifests either the resistance value $R_0$ of UUT alone or the resistance value of the contact resistances RC1 and RC2 in addition to the resistance value $R_0$ of UUT. In the switch position as shown with S1 connected to terminal 16 and 18, the resistance values of RC1, RC2 and UUT are represented by the output signal of amplifier 20. When the switch of S1 is connected to terminals 8 and 14, only the resistance value $R_0$ of UUT is measured. The former value including RC1, RC2 and $R_0$ is represented by signal e, FIG. 8, period $t_6$, which is supplied to a recorder and display (not shown) for example a digital oscilloscope and/or other recording system. The contact resistance is compared to $R_0$ to determine if the contacts are worn and should be replaced. Normally a signal representing the value of $R_0$ is otherwise generated during period $t_1$.

A constant current pulse generator 22 is coupled to the nodes 2 and 4 for supplying a sequence of two successively generated contant current pulses signal f, FIG. 8. A control 24, which may be a computer, controls the pulse generator 22 and the switch position of switch S1 and switch S2 which couples the output of amplifier 20 to null bridge circuit 26. Control 24 controls the state of switch S1 with signal d, FIG. 8.

The null bridge circuit 26 receives the signals at nodes 3 and 5 to set the coarse value of R4 and the signals at nodes 1 and 3 to set the fine value of R4 to balance the bridge in response to appropriate control signals from the control 24 during period $t_1$. Also, the circuit 26 opens and closes switch S2 for selectively opening the bridge in period $t_1$, signal h, for the purpose of measuring the value of the resistances $R_0$ or RC1, RC2 and $R_0$ during the balance portion of a cycle period $t_1'$. The value of the signal at the nodes 3 and 5 applied to the null bridge circuit 26 is used for purposes of setting the value of R4 during $t_1$ for coarse nulling the bridge 12. The output node signals at nodes 1 and 3 are applied as inputs to amplifier 28 for the thermal transient test response of the UUT when the UUT receives constant current pulse 32, FIG. 8, period $t_2$. Pulse 32 is of sufficient amplitude to heat the UUT resistance an amount to elevate its temperature so as to produce a thermal response characteristic wave curve f, period $t_2$.

In FIG. 8, the output of the current pulser generator 22 signal j comprises two pulses 30 and 32 forming a test cycle. Pulse 30 has a duration $t_1$ of about 15 ms. At the end of this 15 millisecond period a trigger signal is generated followed by a 1 ms null current followed by transient test current pulse 32. Pulse 32 has a settable duration of 1 to 99 ms in one ms steps, preferably about 20 to 30 ms in duration.

Pulse 30 serves several purposes. It is utilized to produce a current at nodes 3 and 5 in FIG. 1 and creates a voltage across the UUT alone and in combination with RC1 and RC2, the latter of which is sensed by amplifier 20 when the amplifier 20 is connected as shown by switch S1 in solid line. The value of the resistance of UUT is also measured in response to the current pulse 30 by the normal state of switch S1 (the open state of FIG. 1) so that it connects terminals 8 and 14 to amplifier 20. This couples only the resistance of UUT to amplifier 20 whose output signal e represents the resistance value $R_0$ of UUT. At the beginning of the cycle in period $t_1$, period $t_1'$ signal h, the switch S2 is opened by the null bridge circuit 26 so that the current pulse 30 is forced primarily through UUT.

During period $t_1'$, signal h, the output signal at nodes 3 and 5 representing the value of the resistance $R_0$ is applied to the null bridge circuit 26. The null bridge circuit 26 in response to this signal sets the value of resistance R4 of the settable resistance approximately to the value of resistance R3 using the voltage across the cold $R_0$ of UUT. Switch S2 is then closed at end of the period $t_1$ producing an output signal at output nodes 1 and 3. The signal at the output nodes 1 and 3 represents the null condition of the bridge 12. This signal is applied to the null circuit 26 which then fine tunes the value of resistance R4 so that R3/R2=R4/RC1+RC2+$R_0$ and the current at nodes 1 and 3 exactly match and the bridge is nulled. That is, in response to any difference in currents at nodes 1 and 3, generated by the coarse value of resistance R4 set using $R_0$, R4 is altered by circuit 26 using the bridge null current until the bridge is nulled. All of this occurs within the 15 ms of period $t_1$.

Figure 3:
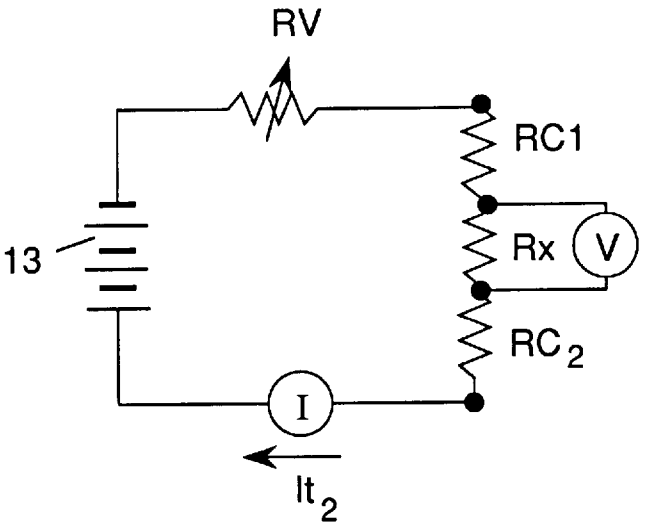
FIG. 3 is a circuit diagram of a four wire circuit for measuring the value of a resistance for explaining further principles of the present invention in the embodiment of FIG. 1.

FIG. 3 represents the circuit of FIG. 1 when the switch S2 is open. $R_x$ in FIG. 3 represents $R_0$. A volt meter V across resistance $R_x$ measures the voltage across this resistance in response to a current flowing through the network comprising series resistance RC1, $R_x$, RC2 and a variable resistance RV. The current flowing is $I_{t2}$. A battery 13 applies the current. The voltage produced by the volt-meter V is a measure of the value of $R_x$. The condition of FIG. 3 is represented by the state of the circuit of FIG. 1 when the switch S2 is open and the switch S1 is connected as shown in solid line to terminals 16 and 18. The resistance R2 of FIG. 1 represents the value of RV in FIG. 3. The battery 13 represents the pulse generator 22.

Figure 2:
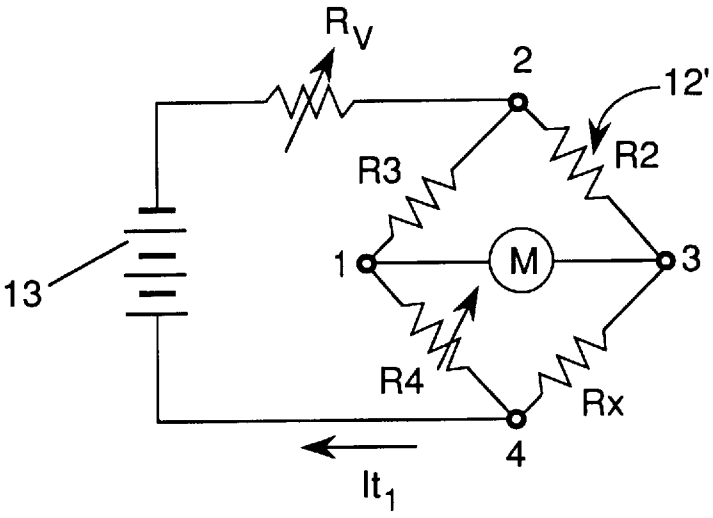
FIG. 2 is a circuit diagram of a wheatstone bridge for illustrating certain principles of the operation of the circuit of FIG. 1.

After switch S2 is closed, the circuit of FIG. 2 is produced. In FIG. 2, a wheatstone bridge 12' comprising resistances $R_x$, $R_2$, $R_3$ and $R_4$ are connected in four branches in which a meter M is connected between two output nodes 1 and 3 between resistance branch pairs $R_3$, $R_4$ and $R_2$, $R_x$. The battery 13 is connected to the input nodes 2 and 4. The value of resistance $R_4$ in FIG. 2 is varied until the meter M registers a null, that is, no current flows therebetween at nodes 1 and 3. In FIG. 1, circuit 26 sets the value of $R_4$ when switch S2 is open to produce the condition of FIG. 3 and then is closed to produce the condition of FIG. 2 so that the current at nodes 1 and 3 during the latter portion of the period $t_1$ of pulse 30 is set to a null.

After the bridge is nulled, the second current pulse 32, FIG. 8, is applied by generator 22 to nodes 2 and 4, FIG. 1. This pulse has sufficient amplitude such that it will heat the resistance $R_0$ of UUT. At this time because of the heating of UUT, its thermal response characteristic is such that its resistance changes so that the current at nodes 1 and 3 shifts as illustrated by signal f, FIG. 8, in period $t_2$. This signal is amplified by amplifier 28 and applied to a recorder and oscilloscope display (not shown) for recording the thermal response characteristics during period $t_2$. Because the unit under test resistance $R_0$ has been balanced in the bridge when the bridge has been nulled the value of resistance $R_0$ is not included in the waveform f, period $t_2$.

Figure 9A:
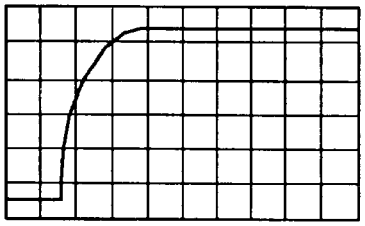
Figure 9D:
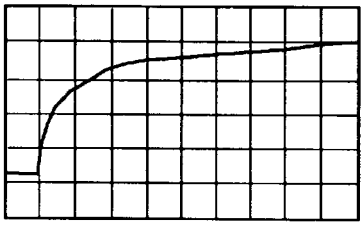
Figure 9B:
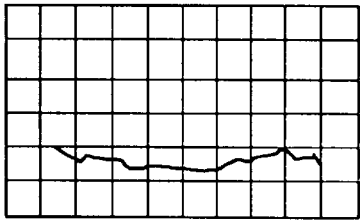
Figure 9E:
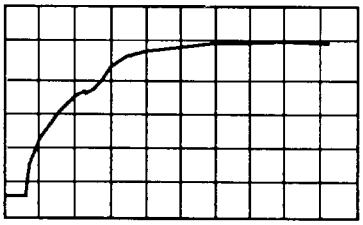
Figure 9C:
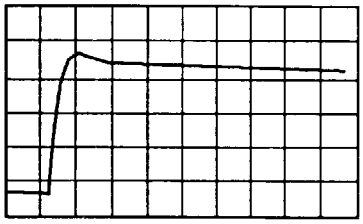
Figure 9F:
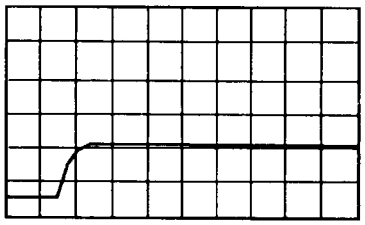

The various responses of the UUT for different UUTs having different thermal characteristics is illustrated in FIGS. 9*a* through 9*f*. FIG. 9*a* illustrates a normal response. FIG. 9*b* illustrates a poor bridge wire weld. That is the unit under test resistance $R_0$ is not properly connected to its terminals causing an open condition and thus the poor response. FIG. 9*c* illustrates a relatively steep response curve at the leading edge of the waveform which illustrates entrapped solvents, phase transformation and so. FIG. 9*d* illustrates a poor contact in which the response curve does not curve smoothly from its zero level. FIGS. 9*e* and 9*f* show other defective conditions of the unit under test including bridge wire movement due to an air gap, FIG. 9*e,* and a low thermal response, FIG. 9*f*.

In FIG. 4, constant current pulse generator 22 is shown in more detail. Control 34, which may be a computer, is set into operation via a manual/automatic switch 36 which is a front panel/manual switch on the system. The control 34 includes encoded instructions and associated memory for storing the current levels of the transient pulse 32 of waveform j, FIG. 8. Also, appropriate addresses are stored in the control 34 which address decoder 38. The current pulse 32 is in the form of data and supplied to registers 40 and 42. The decoder 38 supplies decoder addresses to multiplexors 44 and 46. The data from the decoder 38 sets the multiplexors to either process current pulses automatically as set by control 34 or manually as will be described. The control 34, in the automatic mode, supplies data representing waveform j, FIG. 8, pulse 32 to register 40 and to register 42 via lead 48. This data on lead 48 supplied to registers 40 and 42 represents the automatically set test currents for the transient thermal response test, pulse 32. The registers 40 and 42 serve as latches for storing these values until outputted to the multiplexors 44 and 46 as selected by the address decoder 38.

Oscillator 50 provides a manually set slow or fast output through a switch 51 which selects a rate for incrementing counter 54 up or down as selected by switch 52. The counter 52 is used to manually select the value of the amplitude of the current of waveform j, pulse 32 for the thermal transient test mode. Multiplexor 44, according to the position of switch 36, passes the data from register 40 to a comparator 56. A set pulse duration device 61 is coupled to multiplexor 44 for setting the duration of pulse 32. Device 61 comprises an array of BCD switches for setting the duration of pulse 32 in a range of 1 to 99 ms. Multiplexor 46 passes to its output either the automated selected test current values or the manually selected values of counter 54 to multiplexor 58. An input to the multiplexor 58 is a set balance current device 60. Device 60 manually sets the balance current, pulse 30, amplitude to a critical value for a given system. Once set, it no longer need be reset as it is only for calibration. The balance current pulse 30 is always provided automatically. Mode select switch 36 causes timing control 96 to generate a mode select signal m applied to multiplexor 58 which selects either the manually generated pulse 32 or the automatically generated pulse 32.

In the manual mode, the test current digital value for pulse 32 is derived from the output of the up down counter 54. On power up, the counter 54 is cleared to zero. Using the manual controls on the front panel, switches 51 and 52, counter 54 is incremented or decremented to set the amplitude of pulse 32 using a selectable fast, for example 62 Hz or slow, for example 2 Hz count rate. These count rates determine the digital value of pulse 32 amplitude. The operator places a front panel safety switch (not shown) to the safety position. This is to preclude applying current to the bridge network and adjusts the current display on display 80 to the pulse 32 value desired using the up and down control switch 52 and the rate control switch 51.

Under control of control 34, register 42 holds the digital value for the test current level pulse 32 for automatic operation. It is important to note that the actual digital value in register 42 may not be precisely related to the actual current obtained at the UUT. However, the current relationship will be sufficiently close. The test level current digital value pulse 32 is determined by register 42 or counter 54 according to the automatic/manual switch 36 and switches 51 and 56.

The set balance current device 60 is a set of DIP switches which provide 10.00 milliamps of current for creating pulse 30 for balancing. Device 60 is an internal control and is used to set the balance at current pulse 30 during calibration and is not utilized thereafter. The multiplexor 58 receives the output of multiplexor 46 and device 60. Multiplexor 58 supplies its output as an input to digital to analog converter 62, which produces an analog signal representing pulses 30 and 32. Multiplexor 58 is automatically switched from producing pulse 30 to producing pulse 32 by signal k from control 96.

The output of converter 62 is supplied as an input to constant current generator 86 to the inverting input of amplifier 68. The output of amplifier 68 is supplied to a triple Darlington transistor network represented by PNP transistor amplifier 70. The amplifier 68 output is supplied to the control electrode of amplifier 70. The emitter of amplifier 70 is connected to the inverting input of high impedance buffer amplifier 72 whose output is supplied to a threshold current sense circuit 74 and to a sample hold circuit 76. The threshold current sense circuit 74 senses when the current of pulse 32 from amplifier 72 exceeds a desired threshold value and provides a signal to indicator 78 such as an LED for indicating when the current of pulse 32 has exceeded that threshold. The output of the sample hold circuit 76 is supplied to a voltage to current converter 79 which supplies its output to a digital display 80. The display 80 displays the current values of the generated pulse 32 so that an operator operating switches 51 and 52 can visually observe the value of the currents being being generated by the system either in the manual or automatic modes. The indicator 78 indicates to the operator when the current of pulse 32 has exceeded the desired threshold level. The output of converter 79 is also an acknowledge signal for control 34.

Constant current generator 86 includes a voltage regulator 82 which supplies a constant voltage, for example 9 volts dc, to current range selector 84 and to the non-inverting input of amplifier 72. Range selector 84 comprises a series of three settable resistances which are selected from a front panel switch on the system for providing three ranges of test currents. For example the ranges are set to 2, 20, and 200 ohms corresponding respectively to 2,000 milliamp, 200 milliamp, and 20 milliamp ranges for pulse 32 using a switch (not shown). The voltage drop across the range sensing resistance corresponds to a maximum current for that range when the voltage drop is 4.096 volts, the maximum output of converter 62. Which one of these resistors is selected determines the current range for the output current of amplifier 72. The output of the range selector 84 is supplied to the emitter of transistor 70 and to the inverting input of amplifier 68. The amplifier 68, transistor 70, selector 84 and buffer 72 form the constant current generator 86.

The constant current pulses 30 and 32 produced at the output of amplifier 72 manifest the value of the analog voltage produced by converter 62. In turn, the value of the code words supplied to the converter 62 is determined by the multiplexor 58 which provides in sequence a balance test current pulse 30 and a thermal transient test current pulse 32, signal j, FIG. 8. The output of amplifier 72 in generator 86 is a constant current at that value supplied by converter 62 having a range of current values determined by selector 84.

Amplifier 68 serves as a servo to drive the transistor 70. The servo loop circuit attempts to alter the current flow through the selected series sense resistance of range selector 84. The series sense resistances of selector 84 provide a voltage drop whose current is applied to the non-inverting input of amplifier 68. Therefore, the series range selector serves to select a particular level of output current in accordance with the selected resistance.

The output current from amplifier 68 is also supplied via the collector of transistor 70 to switches 88 which are ganged together and are under control of logic control 90. Switches 88 may be a Darlington transistor network which provides the output of amplifiers 68 and 70 either to a dummy load 92 or to output terminal 2 of bridge 12, FIG. 1. The other terminal 4 of the bridge is connected to a reference potential, for example, system ground. The current from transistor 70 branches into the two paths determined by switches 88. When supplied to terminal 2 the current is supplied during pulses 30 and 32. When not used for measurement, the current flows through the dummy load 92 which may be a 2 ohm 3 watt load resistor. This reduces the slew time for establishing the current flow during the pulses. Without the dummy load, the current would be required to slew from zero to the desired level which would increase the test time. Thus the dummy load provides a more rapid test cycle. To reduce power dissipation, both sides of the switches 88 are off before and after each pulse 30 and 32. Current is never shut off during the pulse period but is merely transferred from the dummy load 92 to the bridge 12. Logic control 90 is also responsive to a control signal applied at terminal A from comparator 56 signal g, FIG. 8. This indicates the end of a test cycle and causes the switches 88 to switch from the position shown in solid to the other switch position. Signal k is a timing signal which starts the period of pulse 32. The operational amplifiers and D/A converter 62 settle during the time the dummy load is connected. Switches 88 may be two Darlington networks.

An oscillator 94 supplies a clock, for example, 1 ms clock cycle, to timing control 96 and to pulse duration counter 98. The test pulse duration of pulse 32 can be set under manual control to any value from 1 to 99 ms as mentioned above. The 1 ms basic time period is derived from oscillator 94. This is a 2.048 MHz oscillator which is fed to counter 98. The counter 98 output maintains a precise 1 ms period. This clock signal output from counter 98 is fed to a dual decade counter forming comparator 56. During the test cycle, the comparator 56 counts until the output bits are equal to those at the other inputs thereto. These other inputs are supplied by multiplexor 44 from register 40. It should be recalled that the inputs from multiplexor 44 are the data supplied by the computer 34 via register 40. The multiplexor 44 based on the input signals determines whether the pulse duration will be based on the front panel thumbwheel switches (not shown) or the value loaded into register 40 by computer control. In addition there are gating functions applied to the comparator 56 which determine if and when the count process begins. These gating functions are not shown. The output of comparator 56 is signal g, an end of cycle signal, supplied to the control logic 90 via terminal A.

A timer 100 responsive to the oscillator 94 generates repeat clock signals on line 102 which is coupled to timing control 96 through manual switches 102 and 104. A second terminal of switch 102 is connected to a manual push button switch 106. Depending on the position of switch 102, either the pulser generator 22 will generate multiple repetitive cycle of signal j or will generate a single cycle. Switch 102 is coupled to push button switch 106 such that only a single cycle is produced. Push button switch 102 is on the front panel.

Switch 36 selects whether or not the current pulse 32 produced at terminals 2 and 4 is manually produced or automatically produced. Switch 36 selects the manual position as shown in solid line. The balance pulse 30 is always the same. When coupled to the automatic position, the timing control 96 is coupled to the fire signal output of control 34 which automatically operates the timing control 96 to generate the appropriate timing signals for automatic operation. The term "fire" means to generate pulses 30 and 32 automatically. The repetitive operation of the signal produced by timer 100 is applied to control 96 in the manual position of switch 36 and in the repeat position of switch 102.

Timing control 96 is responsive to the oscillator 94 for generating a balance clock signal a, FIG. 8, a synchronization signal (sync signal) b, a trigger signal R/C, trigger signal k and a cycle duration signal $C_D$. The trigger signal k is produced at the end of the current balancing pulse 30 and is applied as an enable signal to the pulse duration counter 98, FIG. 4. This causes a comparator 56 to generate trigger signal g which is used to operate the logic control 90. The trigger signal k is timed to be generated by the initial transition of the cycle duration signal $C_D$. This latter signal manifests the duration of the pulses 30 and 32 in a given cycle.

The timer control 96 also generates a signal R/C. This signal is supplied to the control 90 for starting the conversion cycle of D/A converter 62. That is, when logic control 70 receives the signal R/C, the switches 88 switch position to that shown in solid, the switches previously being in the position in which the dummy load 92 receives the current from current generator 86. When the R/C signal is received, this starts the cycle which occurs slightly after the start of the cycle duration signal $C_D$.

There is thus a 15 ms fixed period of low level current output pulse 30, a one ms delay period of zero current and then the high level test current level pulse 32 is applied to terminals 2 and 4 for the specified duration. Timer 100 includes, for example, a monostable/astable multivibrator (not shown) to trigger the repetitive pulse cycles. The manual period can be adjusted and is set to one cycle per second in this embodiment.

The computer interface with control 34 comprises an 8 bit parallel input. All input and output lines to the computer interface are TTL logic levels. Four of the bits are the data bits and the remaining four bits are used to address the address decoder 38. After the data and address bits are set, control 34 toggles a data available line to load registers 40 and 42. Register 40 is used to fire the current pulser generator 22 under control of control 34. At the end of the test pulse 32 duration, a pulse from converter 79 is returned on a data accept line 81 to the control 34 to signal the completion of a test cycle.

When the converter 62 has all ones on its input it registers a 4.096 volt output. However, this is in a preferred embodiment and other values may be used in accordance with a given implementation. The repetitive pulse cycle of timer 100 may be set preferably at a 1 Hz repetition rate.

In FIG. 7, circuit 110 generates the timing signals utilized in the present system. A balance clock signal a from control 96 is applied to a clock and gate 112 which receives as a second input an enable signal from the Q output of a flipflop 114. The clock input of flipflop 114 is received from a one shot monostable multivibrator 116 Q output. The reset input of one shot multivibrator 116 is the cycle duration signal $C_D$. The Q output of multivibrator 116 is also supplied to a reset input of counter 118. The output of gate 112 is supplied to the clock input of counter 118 and to an inverter 120. The output of inverter 120 is applied to the ST input of decoder 122.

One output of the counter 118 is supplied to the INH input of decoder 122 which may be a 145 14*b* decoder. The other outputs of counter 118 are supplied to the data inputs of the decoder 122. One output of the decoder 122 is applied to the reset input of a one shot multivibrator 124. The Q output of one shot multivibrator 124 is a count disable signal on line 126. This count disable signal is applied to the reset input of flipflop 114. The outputs of the decoder 122 provide trigger timing signals for the various circuit functions.

One output is a first control signal R+RC. A second signal is signal R/C. A third signal is supplied to the clock input of flipflop 126 whose reset input is received from an output of decoder 122 for generating sample hold signal S/H. A fourth signal is generated via flipflop 128 which receives as its reset input a signal from the output of decoder 122 output. The Q output of flipflop 128 is bridge control signal h. By way of example, the signal R+RC may be one ms wide and occurs 13.5 to 14.5 ms from the start of cycle duration $C_D$. Signal R/C may be one ms wide and occurs 5 to 6 ms from the start of the cycle duration $C_D$. The signal S/H may be one ms wide and occurs 11.5 to 12.5 ms from the start of $C_D$. Bridge control circuit signal may be 5 ms wide and occurs 1 to 6 ms from the start of the cycle duration signal $C_D$. Circuit 110 is included in timer control 96.

In FIG. 5, the adjustable resistance R4 and null bridge circuit 26 are shown in more detail. The current from the bridge 12 FIG. 1 is supplied to terminals 1 and 4. The current $I_{in}$ at node 1 is applied through switch S2 which is a relay having a coil 131 whose contacts normally are closed as shown for supplying the current $I_{in}$ to the resistor R4 network. When a bridge control signal h' is applied to the coil 131 the contacts of switch S2 switches to the other switch position and opens for a period of about 5 ms starting one ms after the falling edge of $C_D$. This action causes all the balance level current pulse 30 to flow through the UUT in a test arm of the bridge 12.

The balancing current pulse 30 provides the current at terminals 3' and 5' to amplifier 130 whose output is applied to analog to digital (A/D) converter 132. The output of A/D converter 132 is supplied to a set of decoders 136, 138, 140 and 142. Decoder 136 receives an input bridge control signal h. A second input to the A/D converter 132 is the R/C signal which occurs at the end of the bridge control signal h when the relay 130 returns to its normally closed position of FIG. 5. The voltage across terminals 3' and 5' represents the cold resistance $R_0$ of the unit under test. This voltage is applied to the converter 132 through amplifier 130 and is decoded by decoders 136 through 142 which address selected ones of the series connected resistances K0–K11. The resistances K0 through K11 each have a fixed value for example as illustrated in the Table of FIG. 6*b* which will be explained in more detail below.

The resistances K0–K11 are serially connected in accordance with the encoded output signals of the decoders 136–142. The converter 132 receives the voltage, signal e, across terminals 3' and 5' and according to the value of that voltage provides an output digital code that is predetermined to select certain of the resistances K0 through K11 which together approximately match the resistance R3. This is a quantized value. This sets an approximate value of R4 so that it is close in value to that of resistance R3. In effect, the converter 132 provides a digital output number that represents the value of the resistance R3 in response to receiving a voltage at terminals 3' 5' corresponding to resistance $R_0$.

Converter 132 acts as a multiplier performing a function similar to that of a digital multimeter display which converts a voltage to a digital readout. In this case, however, the digital number produced by converter 132 is used to select resistances. By way of example, the resistance R3 may have a value of 2660 ohms as mentioned previously, whereas the resistance R2 may have a value of 5 ohms. The resistance of the series connected resistors K0–K11 thus are set to approximate a value of 2660 ohms. This resistance is set to be relative to the value of the resistance $R_0$ since it is the relative relationship of these resistances which is important for balancing the bridge. That is, the value of R3/R2 should be the same as the value of R4/$R_0$ including the contact resistances RC1 and RC2. However, the value of the contact resistance RC1 and RC2 are considered negligible for this purpose. As their values increase, the system will measure those values as mentioned previously which will indicate that the socket for the UUT needs to be replaced because those resistances are too high. Thus, the value of $R_0$ is a determining factor by which of the resistances K0 through K11 are selected.

In FIG. 6*a,* a representative resistance K0 comprises an NPN transistor 144 whose control electrode is connected to terminal 146 which is coupled to an output of the decoder 138. The emitter of transistor 144 is coupled to a reference potential, i.e., ground. A diode 148 cathode is connected to the collector of transistor 144 and its anode is connected to the emitter. Resistances are supplied in circuit with the transistor 144 for bias. A positive voltage is coupled through relay coil 150 to the collector of transistor 144 and to the cathode of diode 148. Relay coil 150 has a normally closed position in which contact 152 bypasses the serially connected resistances X and Y. The contact 152 in its normally closed position connects terminal 154 to terminal 156 bypassing resistances X and Y. Upon receipt of a control signal from decoder 138 at terminal 146 the transistor 144 causes the relay coil 150 to be coupled to ground. This causes a current to flow through the relay coil 150 causing the contact 152 to switch position. This connects the resistances X and Y in circuit between terminals 154 and 156. Y is a settable resistance which is preset to a given value. The values of resistances X and Y are shown in the table of FIG. 6*b* for each of the serially connected resistances K0–K11. All of these resistances K0 through K11 are identical in construction except for their values as shown in FIG. 6*a* and are serially connected as shown. When the appropriate relays 150 of each of the resistances K0–K11 are coupled according to the encoded output of decoders 136 through 142, set by converter 132, the values of those resistances that are connected in series approximate the relative value of resistance R3 to that of R2 so that the relative value of R4 to $R_0$ is approximately the same.

A second amplifier 160, FIG. 5, is connected to a sample hold circuit 158. The inputs of amplifier 160 are connected to nodes 1 and 3 which are the null output nodes of the bridge 12, FIG. 1. This represents the balance current of the bridge. Because the value of R4 is set approximately to that of R3 and the relative values of R4 to $R_0$ are approximately the same as the relative values of R3 to R2, further fine tuning of the value of R4 is required to more precisely balance the bridge 12. Therefore, any null current that is not zero between nodes 1 and 3 will provide a signal input to amplifier 160 which provides an output to sample hold circuit 158.

The output of sample hold circuit 158 is controlled by the S/H signal applied to the sample hold input for producing an output at line 162 in response to the S/H signal. The output on line 162 is supplied to the gate electrode of field effect transistor (FET) 164 through resistance 166. A resistance 168 is coupled to the drain and control electrodes of FET 164. The drain electrode is also coupled to the output of the last resistor K11 of the resistor network R4. A third resistance 170 is coupled across the drain and source electrodes of the FET 164 and to the output mode 4 of bridge 12. The source electrode is coupled through capacitor 172 to the sample hold circuit 158.

During the period of signal R/C which occurs about 5 ms from the falling edge of $C_D$ and which has a duration of 1 ms, convertor 132 converts the analog voltage at its input to a digital value that is proportional to the UUT device resistance $R_0$+RC1+RC2.

The logic signal S/H activates sample and hold circuit 158 for the FET fine balance control. This signal goes low for example 11.5 ms from the falling edge of $C_D$ and remains low for 1 ms. During this period the FET changes resistance to achieve a more precise balance of the bridge 12 circuit. The FET 164 connected in circuit acts as servo loop and attempts to make the current at nodes 1 and 3 at the input of amplifier 160 zero. The resistance of the FET varies in small amplitude values and is sufficient for achieving a balance of the current at nodes 1 and 3.

The logic signal waveform d, FIG. 8, is used to switch the input sense lines to amplifier 28, FIG. 1. This signal goes high 13½ ms from the falling edge of $C_D$ and remains high for one ms. This is for measuring the contact resistance RC1 and RC2. When this signal is low, the output of amplifier 160, FIG. 5, during the balance portion of the cycle, pulse 30, is proportional to the resistance $R_0$ of the unit under test. When the signal is high, the output of amplifier 160 is proportional to the device resistance plus the contact resistance RC1+RC2. When the bridge is open during bridge control signal h the balance resistance of $R_0$ above is established by the circuit. This occurs for a period of about 5 ms. At the end of this period the bridge is balanced and the balance of the current U/SE 32 is applied. After the balancing, the device resistance $R_0$ plus the contact resistance RC1 and RC2 are ascertained for measurement and recording purposes.

At the end of pulse 30, after the 1 ms delay when zero current is present, the test current pulse 32 level is applied to the UUT for determining the transient thermal response of the UUT. The actual value of the current pulse 32 as it is applied across the UUT is of no interest at this time.

In an example, assume a 5 ohm resistance for the UUT and the voltage across the UUT is 0.05 volts. This voltage is sensed at the differential input of amplifier 130. FIG. 5, which amplifies this voltage by a factor of 120 yielding a 6 volt output. This 6 volt output is applied to the converter 132. The converter 132 is set with a reference precise 10 volt level, such that the digital output is 9/10 of the 4095 binary count maximum or 2457. This digital output is latched by the bridge control signal h into the decoders 136–142. The output from these decoders are used to drive the transistors 144 of the resistances K0–K11 of the relay network. If a given bit is a logic high, it will cause a corresponding coil relay 150 to energize. If the relay coil 150, FIG. 6*a*, is energized, it will cause the ladder network resistance value for the relay to be added into the network. If all bits are low, therefore, the ladder network will assume a total value of about zero ohms. If all bits are high, the total network resistance is about 4095 ohms total. thus, for a 5 ohm resistance for the UUT, the ladder network will assume a total resistance of about 2457 ohms, which in turn will cause the bridge to be approximately balanced when the current is applied to both arms of the bridge 12 nodes 2 and 4.

After the course balance value is established by coupling the resistances K0–K11, the balance current is then switched so as to be directed to both arms of the bridge circuit at nodes 1 and 3. Bridge switch S2 is closed There is a few ms of time allocated for relay settling time.

The nonlinearities of this device prevent accuracy normally needed in a system from being achieved. However as the FET is used in the present invention its characteristic resistance is used to provide a resistance essential for balancing the bridge. The digital output of the converter 132, FIG. 5, is a digitization of the input voltage. The drawback of a digitized signal is due to quantization which results from the analog to digital conversion. Thus the FET solves both problems by smoothing out the normal quantization variations of the digitized output of the converter 132 and the coupled resistance in the network of resistances K0–K11.

Thus both an analog based FET and a digital switched resistance ladder are utilized to provide automatic high speed bridge balancing. The resistance ladder reduces the effects of the FET nonlinearity by a factor of one thousand to four thousand. This results in an undetectable level of nonlinear FET effects. In contrast, the relatively small value of the resistance provided by the FET allows correction for quantization errors in the resistor ladder network of resistance R4. Thus the circuit provides both precise measurement and a balanced bridge in a fraction of a second.

What is claimed is:

1. A test apparatus for providing a resistance of a certain value comprising:

control means for generating at least one control signal;

first circuit means including a settable resistance responsive to said at least one control signal for setting said settable resistance to a first value approximating said certain value; and second means responsive to said at least one control signal for setting said settable resistance to a second value which is substantially the same as said certain value.

2. The apparatus of claim 1 wherein said control means includes means for automatically causing initially the setting of said settable resistance to said first resistance value and then automatically causing the setting of said settable resistance to said second resistance value.

3. The apparatus of claim 1 wherein said first circuit means includes a resistor ladder network of series connected resistances of different first values and said second means includes a second variable analog resistance means in series with said first circuit means.

4. The apparatus of claim 3 including a bridge network having first and second pairs of opposing nodes wherein a resistance is between each said nodes, the first pair of nodes comprising an input to said bridge network and said second pair of nodes comprising an output of said bridge network, the current value at said second pair of nodes being the same for providing a null current value therebetween when the resistances between each input node and a first output node have the same relative value as the resistances between each input node and the other output node, said settable resistance being between one of said output and one of said input nodes.

5. The apparatus of claim 4 wherein a second resistance is between the other output and said one input nodes and having a second value, said control means including means for sensing said second value and for producing said control signal in response to said sensing.

6. The apparatus of claim 5 including means for providing a first constant current pulse of a first magnitude to said bridge network for providing a current through said second resistance manifesting said second value and for nulling said bridge network with said settable resistance, said first magnitude being sufficiently low such that the resistance of said second value exhibits negligible temperature change during said providing and said nulling and then providing a second constant current pulse of a magnitude sufficiently greater than the first magnitude for increasing the temperature of said second resistance.

7. The apparatus of claim 6 including means for automatically successively applying said first and second pulses to said bridge network and including means for recording the thermal response of said second resistance caused by said temperature increasing.

8. The apparatus of claim 6 including means for setting the duration of each said pulses.

9. The apparatus of claim 6 including means for setting the amplitude value of said first and second current pulses.

10. The apparatus of claim 6 include current range setting means for setting the current values of said pulses to different ranges of values.

11. The apparatus of claim 3 wherein said second resistance is non linear, said first circuit means including means for generating a first signal manifesting the value of said first resistance, means for digitizing said first signal, said control means including means for causing said digitized signal to select certain of said series connected resistances to provide a digitized linear approximate value of said series connected resistances, and said second means including means for coupling said first and second means in series to form a third resistance, said control means for coupling said first and second means so the third resistance forms one branch of a wheatstone bridge and for applying a current to said bridge such that the value of said third resistance assumes a nulling value for the bridge.

12. The apparatus of claim 11 wherein said bridge has first, second, third and fourth branches, said third resistance comprising the first branch, a fourth resistance comprising the second branch, a fifth resistance comprising the third branch and a sixth resistance comprising the fourth branch, the first and second branches having resistance values substantially different than the resistance values of the third and fourth branches, said control means including means for generating said control signal to response to a sense signal generated in response to sensing the value of the fifth resistance.

13. The apparatus of claim 12 wherein said control means includes amplifier means for amplifying said sense signal, analog to digital converter means for digitizing said amplified sense signal and address means responsive to said digitized signal for selecting said certain series connected resistance and wherein the value of said fifth resistance is substantially lower than the value of the third resistance.

14. The apparatus of claim 13 wherein said fifth resistance has an unknown value approximately of the same magnitude as the sixth resistance, said control means including means for determining the value of said fifth resistance.

15. The apparatus of claim 14 wherein said control means includes means for opening said bridge to provide a voltage across said fifth resistance manifesting the value of said fifth resistance.

16. The apparatus of claim 13 including means for providing a current pulse through said fifth resistance to elevate the temperature of said fifth resistance after said nulling and means for recording the thermal response of said fifth resistance to said elevated temperature.

17. Apparatus for determining the thermal transient response of a resistor comprising:

wheatstone bridge means including a plurality of resistor branches, a first resistor forming one of said branches;

a settable resistor forming a second of said branches; and means for automatically setting the settable resistor value so that the relative values of said first and settable resistors are the same as the relative resistor values of the remaining branches.

18. The apparatus of claim 17 including means for generating a signal manifesting the value of said first resistor, means responsive to said signal for automatically setting the value of said settable resistor to approximate the resistance value of the resistance in a third branch, means for automatically nulling said bridge means with said settable resistor to substantially the same value as said resistance value in said third branch, means for injecting a current through said first resistor to elevate its temperature after said nulling and means for recording the thermal response of said first resistor in response to said elevated temperature.

19. The apparatus of claim 17 wherein said means for automatically setting including a resistor ladder network of series connected resistances of a plurality of first linear values and a second variable analog non linear resistance means in series with said first circuit means, and first means responsive to the sensed value of the first resistor for selecting certain of said series connected resistances and and second means responsive to the null current value of the bridge for setting the analog resistance means so that the settable resistor value is such that said bridge means is substantially nulled.

20. The apparatus of claim 17 including means for providing a first current pulse of a first magnitude to said bridge means for nulling said bridge means with said settable resistance, said first magnitude being sufficiently low such that said first resistor exhibits negligible temperature change during the nulling and then providing a second current pulse of a magnitude sufficiently greater than the first magnitude for raising the temperature of said first resistor.

21. The apparatus of claim 20 including means for automatically applying said first and second pulses to said bridge means and means for recording the response of said first resistor to said temperature raising.

22. An apparatus for automatically nulling a wheatstone bridge comprising:

first, second, third and fourth resistances each forming a different branch of said bridge, the first and second resistances having different values, the third and fourth resistances having values corresponding to the respective values of the first and second resistances, said bridge having input nodes between the first and second resistances and between the third and fourth resistances and output nodes between the first and third and between the second and fourth resistances;

means for supplying said second resistance of unknown value and approximately the value of the fourth resistance; and means for automatically setting the value of the first resistance to null said bridge at said output nodes.

23. The apparatus of claim 22 wherein said first resistance comprises a linear resistance in series with a non linear resistance, said means for automatically setting including means for approximating the value of said third resistance with said linear resistance and means for changing said approximate value of said third resistance with said non linear resistance to substantially null the bridge by setting the value of said non linear resistance.

24. The apparatus of claim 23 wherein said linear resistance comprises a ladder network of serially connected fixed value resistances and said non linear resistance comprises a field effect transistor (FET) connected in series with said ladder network and servo means responsive to the null signal value of said bridge at said output nodes for setting the resistance of said said bridge with the resistance of said FET.

25. The apparatus of claim 23 wherein said means for approximating the value of said first resistance includes means for injecting a current through the second resistance to produce a voltage manifesting the value of said second resistance and means responsive to said voltage for generating a control signal for selecting the value of said linear resistance to approximate the value of said third resistance and means responsive to said control signal for sensing the current at said output nodes caused by said injected current and for setting the value of said non linear resistance so that the values of the currents at said output nodes match.

26. The apparatus of claim 22 further including means for automatically injecting a constant current through said second resistance after said bridge is nulled for determining the thermal response of said second resistance.

27. The apparatus of claim 26 including a constant current generating means for generating a first current pulse of a first value for said nulling and a second constant current pulse for determining said thermal response, said first and second pulses being generated successively.

28. The apparatus of claim 27 including a current generator for generating a constant current of a given amplitude corresponding to the first current and dummy load means for receiving said current of a given amplitude corresponding to said first current pulse prior to applying said first pulse to said bridge.

29. The apparatus of claim 27 wherein said current generator comprises means for providing a digital signal manifesting the amplitude of the first and second currents, digital to analog converter means for creating an analog signal corresponding to said digital signal, amplifier feed back means for generating a constant current from said analog signal and terminal means for supplying said constant current to said bridge input nodes.

30. The apparatus of claim 29 including pulse duration set means for setting the duration of each said first and second pulses.

31. The apparatus of claim 30 including pulse amplitude setting means for setting the amplitude of said first and second pulses.

32. The apparatus of claim 29 including means for automatically generating said first and second pulses.

33. The apparatus of claim 29 include means for selecting current amplitude values of different ranges for said first and second pulses.

* * * * *